United States Patent
Bentley et al.

(10) Patent No.: US 9,972,494 B1
(45) Date of Patent: May 15, 2018

(54) METHOD AND STRUCTURE TO CONTROL CHANNEL LENGTH IN VERTICAL FET DEVICE

(71) Applicant: GLOBALFOUNDRIES INC., Grand Cayman (KY)

(72) Inventors: Steven Bentley, Albany, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/351,747

(22) Filed: Nov. 15, 2016

(51) Int. Cl.
| | |
|---|---|
| *H01L 21/3213* | (2006.01) |
| *H01L 21/28* | (2006.01) |
| *H01L 29/786* | (2006.01) |
| *H01L 29/423* | (2006.01) |
| *H01L 29/66* | (2006.01) |
| *H01L 21/265* | (2006.01) |

(52) U.S. Cl.
CPC .. *H01L 21/28123* (2013.01); *H01L 21/26513* (2013.01); *H01L 21/32134* (2013.01); *H01L 21/32139* (2013.01); *H01L 29/42392* (2013.01); *H01L 29/66666* (2013.01); *H01L 29/78618* (2013.01); *H01L 29/78642* (2013.01); *H01L 29/78696* (2013.01)

(58) Field of Classification Search
CPC ......... H01L 21/28123; H01L 21/26513; H01L 21/2139; H01L 21/32134; H01L 29/66666; H01L 29/78696; H01L 29/42392; H01L 29/78642; H01L 29/78618
See application file for complete search history.

(56) References Cited

U.S. PATENT DOCUMENTS

| | | | |
|---|---|---|---|
| 2012/0195122 A1* | 8/2012 | Ohmaru | G11C 14/0063 365/185.08 |
| 2016/0268434 A1* | 9/2016 | Ching | H01L 29/7851 |

* cited by examiner

*Primary Examiner* — Kyoung Lee
*Assistant Examiner* — Christina Sylvia
(74) *Attorney, Agent, or Firm* — Scully Scott Murphy and Presser; Frank Digiglio

(57) ABSTRACT

A method of manufacturing a vertical field effect transistor includes an isotropic etch of a gate conductor to recess the gate and define the length of the transistor channel. A symmetric gate conductor geometry prior to the etch, in combination with the isotropic (i.e., lateral) etch, allows the effective vertical etch rate of the gate conductor to be independent of local pattern densities, resulting in a uniform channel length among plural transistors formed on a semiconductor substrate.

15 Claims, 10 Drawing Sheets

METHOD AND STRUCTURE TO CONTROL CHANNEL LENGTH IN VERTICAL FET DEVICE

BACKGROUND

The present application relates generally to semiconductor devices, and particularly to vertical field effect transistors (VFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

Vertical FETs are devices where the source-drain current flows in a direction normal to the substrate surface. In vertical FET devices, the fin defines the transistor channel with the source and drain regions located at opposing (i.e., upper and lower) ends of the fin.

A challenge associated with a vertical FET architecture is precise control of the channel length across a plurality of fins. The channel length is typically defined by etch back of the gate conductor. However, the removal rate of the gate conductor can vary spatially across a substrate due to local variability in pattern density and associated loading effects. Accordingly, it would be advantageous to provide a robust, vertical FET manufacturing process and associated structure that are compatible with existing circuit designs, while enabling precise dimensional control of the channel.

SUMMARY

In accordance with embodiments of the present application, a method of forming a vertical FET device involves performing an isotropic etch of the gate conductor to recess the gate and define the length of the channel. A symmetric pre-etch gate conductor geometry, in conjunction with the isotropic nature of the etch, decouples the vertical component of the etch rate from the dimensions of overlying or adjacent structures, resulting in a uniform channel length that is independent of local pattern density. The process also simplifies formation of a top spacer and epitaxial raised active regions for source/drain contacts.

According to various embodiments, a method of making a semiconductor device includes forming a plurality of fins over a semiconductor substrate, where an inter-fin spacing is defined between sidewalls of adjacent fins, forming a gate dielectric directly over sidewalls of the fins and over sidewalls of a hard mask disposed over top surfaces of the fins, forming a gate conductor directly over the gate dielectric, wherein the gate conductor thickness is substantially equal to the inter-fin spacing, and isotropically etching the gate conductor to form a functional gate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
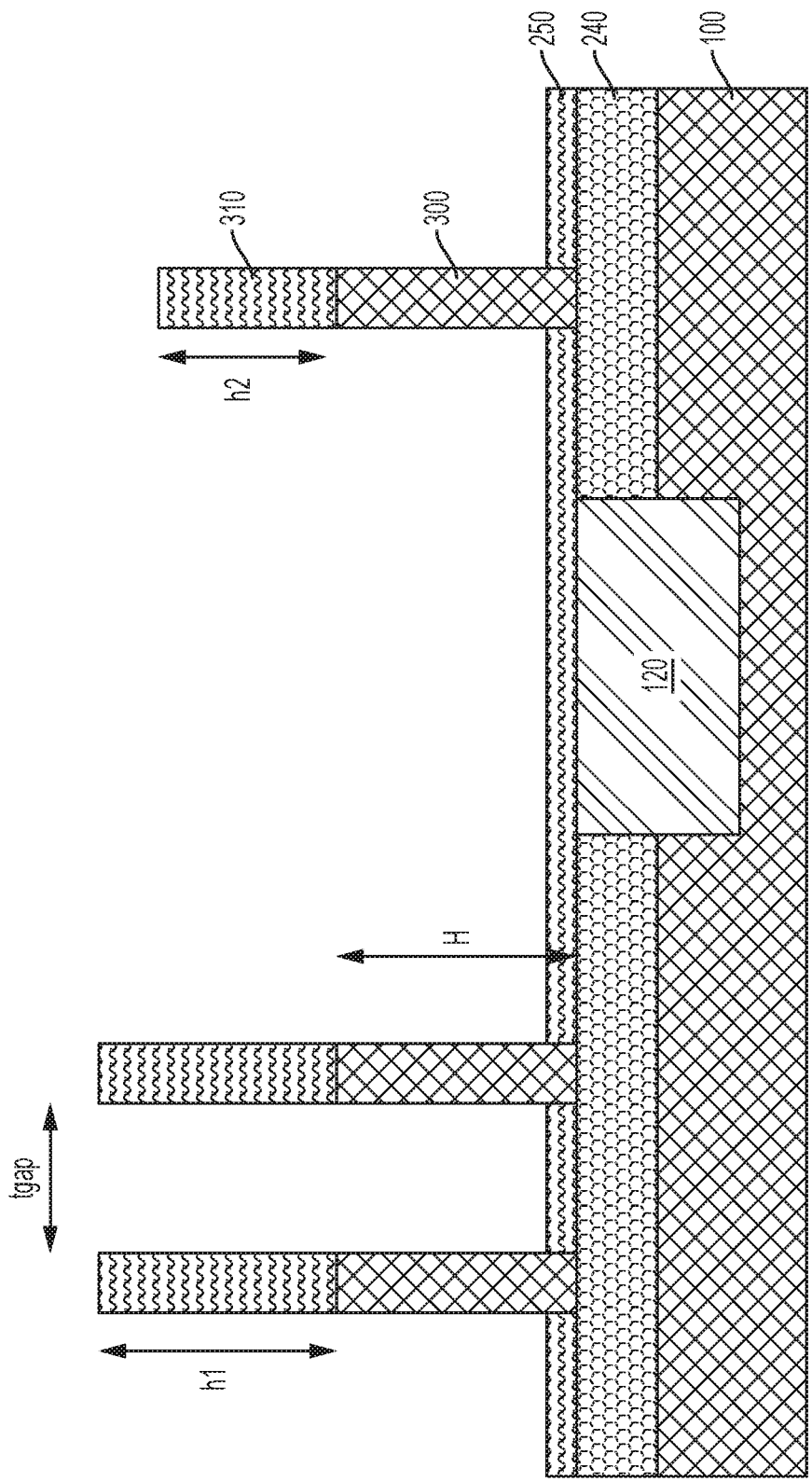
FIG. 1 is a simplified schematic diagram of an example vertical field effect transistor at an intermediate stage of fabrication showing a plurality of semiconductor fins with overlying hard masks formed over a semiconductor substrate according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to the manufacture of semiconductor devices, and more particularly to the manufacture of vertical field effect transistors (VFETs). Exemplary devices include vertical fin field effect transistors having a controlled channel length produced by the isotropic etch-back of a gate architecture that is formed over each fin. As will be appreciated, the channel length is defined by the dimensions of the overlying gate. As such, reference herein to control of the gate length relates also to control of the channel length, and vice versa, unless the context indicates otherwise. In various embodiments, the channel length is substantially constant for plural devices manufactured on the same substrate. As used herein, variability in the channel length amongst a plurality of devices is less than 10%, i.e., 0, 1, 2, 4 or 8%, including ranges between any of the foregoing values.

Reference will now be made to FIGS. 1-10, which together with the following description, provide an exemplary method for manufacturing a vertical FET where the channel length is controlled and substantially invariable across a multitude of devices formed on the same substrate.

With reference to FIG. 1, a vertical FET device at an intermediate stage of fabrication includes a semiconductor substrate 100 having a plurality of fins 300 formed thereon. In several embodiments, the fins 300 are etched from, and therefore contiguous with the semiconductor substrate 100. Substrate 100 may include a semiconductor material such as silicon or a silicon-containing material, and may be a bulk substrate or a hybrid substrate such as a semiconductor-on-insulator (SOI) substrate.

Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

In the illustrated embodiment, substrate 100 is a bulk silicon substrate. In alternate embodiments, the semiconductor substrate 100 may be an SOI substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

A plurality of fins 300 are formed on the substrate 100. In various embodiments, fins 300 comprise a semiconductor material such as silicon, and may be formed by patterning and then etching the semiconductor substrate 100, i.e., a top portion of the semiconductor substrate. The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a hard mask layer 310, which is disposed over a top surface of the substrate 100. The pattern provided by the patterned photoresist material is thereafter transferred into the underlying material layer or material layers (e.g., hard mask 310 and substrate 100) utilizing at least one pattern transfer etching process.

In various embodiments, hard mask 310 comprises a dielectric material such as silicon oxide, silicon nitride, silicon oxynitride or combinations thereof. In particular embodiments, the hard mask layer 310 includes a layer of silicon oxide and an overlying layer of silicon nitride. For example, the hard mask may include a layer of silicon oxide disposed directly over the top surfaces of the fins, and a layer of silicon nitride disposed directly over the layer of silicon oxide.

The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used.

In other embodiments, the patterning process may include a sidewall image transfer (SIT) process or a double patterning (DP) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etching process. For instance, the mandrel material layer may be composed of amorphous silicon or polysilicon. The mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (not shown) on the topmost surface of the structure.

The SIT process continues by forming a dielectric spacer on each sidewall of each mandrel structure. The dielectric spacer can be formed by deposition of a dielectric spacer material and then etching the dielectric spacer material. The dielectric spacer material may comprise any dielectric material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that can be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers. The pattern transfer may be achieved by at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps.

In the illustrated embodiment, the patterned hard mask layer 310 overlies respective ones of the fins 300. At this stage of processing, the thickness of the hard mask (h1) overlying a first fin may be different than the thickness of the hard mask (h2) overlying a second fin. Alternatively, or in combination with the foregoing, the hard mask thickness over a first region of a first fin may be different than the hard mask thickness over a second region of the first fin. In certain embodiments, the thickness of the hard mask over a first fin differs from the thickness of the hard mask over a second fin by at least 10%, e.g., 10, 20, 30, 40 or 50%, including ranges between any of the foregoing values. In certain embodiments, the thickness of the hard mask over a first region of a first fin differs from the thickness of the hard mask over a second region of the first fin by at least 10%, e.g., 10, 20, 30, 40 or 50%, including ranges between any of the foregoing values. Such inter-fin or intra-fin variability in the thickness of the hard mask may be due to loading-induced variability in the hard mask etch rate associated with the process used to define the fins.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface.

In various embodiments the as-formed fins 300 are free standing, i.e., supported only by the substrate 100, and can comprise a single crystal semiconductor material that extends along a lengthwise direction. As used herein, a "lengthwise direction" is a horizontal direction along which an object extends the most. A "widthwise direction" (W) is a horizontal direction that is perpendicular to the lengthwise direction. Each fin has a height (H) that may range from 10 nm to 100 nm and a width (W) that may range from 4 nm to 30 nm. Other heights and widths that are less than or greater than the values mentioned can also be used. The fins 300 may have an aspect ratio (H/W) ranging from 1 to 5, e.g., 1, 1.5, 2, 3, 4 or 5, including ranges between any of the foregoing values.

In various embodiments, each of a plurality of semiconductor fins 300 extends along a lengthwise direction with a substantially rectangular or square vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

Plural fins may have equal or substantially equal dimensions, i.e., height and/or width. As used herein, "substantially equal" values differ from each other by 10% or less, e.g., 0, 1, 2, 4 or 10%, including ranges between any of the foregoing values.

As will be appreciated by those skilled in the art, a bulk fin cut or fin removal process can be used to remove one or more unwanted fins or fin segments from the intermediate structure. In structures comprising plural fins, i.e., a fin array, each fin may be spaced apart from its nearest neighbor by a periodicity or pitch (d) of 15 nm to 100 nm, e.g., 15, 20, 25, 30, 40, 50, 75 or 100 nm, including ranges between any of the foregoing values. Such plural fins are typically oriented parallel to each other and perpendicular to the library logic flow of a circuit.

The semiconductor material forming fins 300 may be doped, un-doped, or contain doped and un-doped regions therein. Each doped region within the semiconductor fins 300 may have the same or different doping concentrations and/or conductivities. Doped regions that are present can be formed, for example, by ion implantation, gas phase doping, or by dopants that are present in the material used to form the fins. For instance, semiconductor substrate 100 may comprise a dopant prior to forming the fins 300. Fins 300 may be initially and uniformly doped and have a dopant concentration in the range of $1 \times 10^{15}$ atoms/cm$^3$ to $1 \times 10^{18}$ atoms/cm$^3$.

Referring still to FIG. 1, an ion implantation process is applied to the semiconductor substrate 100 to form bottom source/drain (S/D) junctions 240. The choice of dopant may be based on the doping type of the semiconductor substrate 100 and/or the fins 300. For example, if the semiconductor substrate 100 and fins 300 are doped with a p-type material (e.g., boron), the dopant may be n-type (e.g., phosphorus), which results in an n-type S/D junctions (i.e., an NFET). If, alternatively, the semiconductor substrate 100 and fins 300 are doped with an n-type material (e.g., phosphorus), the dopant may be p-type (e.g., boron) to form p-type S/D junctions (i.e., a PFET).

As known to those skilled in the art, doping changes the electron and hole carrier concentrations of an intrinsic semiconductor at thermal equilibrium. As used herein, "p-type" refers to the addition of impurities to an intrinsic semiconductor that creates a deficiency of valence electrons. For silicon, example p-type dopants, i.e., impurities, include but are not limited to, boron, nitrogen, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. In various processes, one or more dopants may be introduced into a semiconductor material by plasma doping, ion implantation, or gas phase doping.

Isolation regions such as shallow trench isolation (STI) regions 120 may be formed in substrate 100, i.e., between fins, by etching regions of the substrate to form trenches that are back-filled with a dielectric layer. For instance, isolation regions 120 may comprise an oxide such as silicon dioxide.

A bottom spacer 250 is formed over the shallow trench isolation 120 and over a top surface of the substrate 100, including directly over bottom source/drain region 240. The thickness of the bottom spacer 250 may range from 1 to 10 nm, e.g., 1, 2, 5 or 10 nm, including ranges between any of the foregoing values. The bottom spacer 250 may comprise, for example, silicon dioxide ($SiO_2$). Alternatively, bottom spacer 250 may comprise other dielectric materials such as silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon dioxide. Bottom spacer 250 is adapted to isolate the bottom source/drain region 240 from a later-formed gate.

Figure 2:
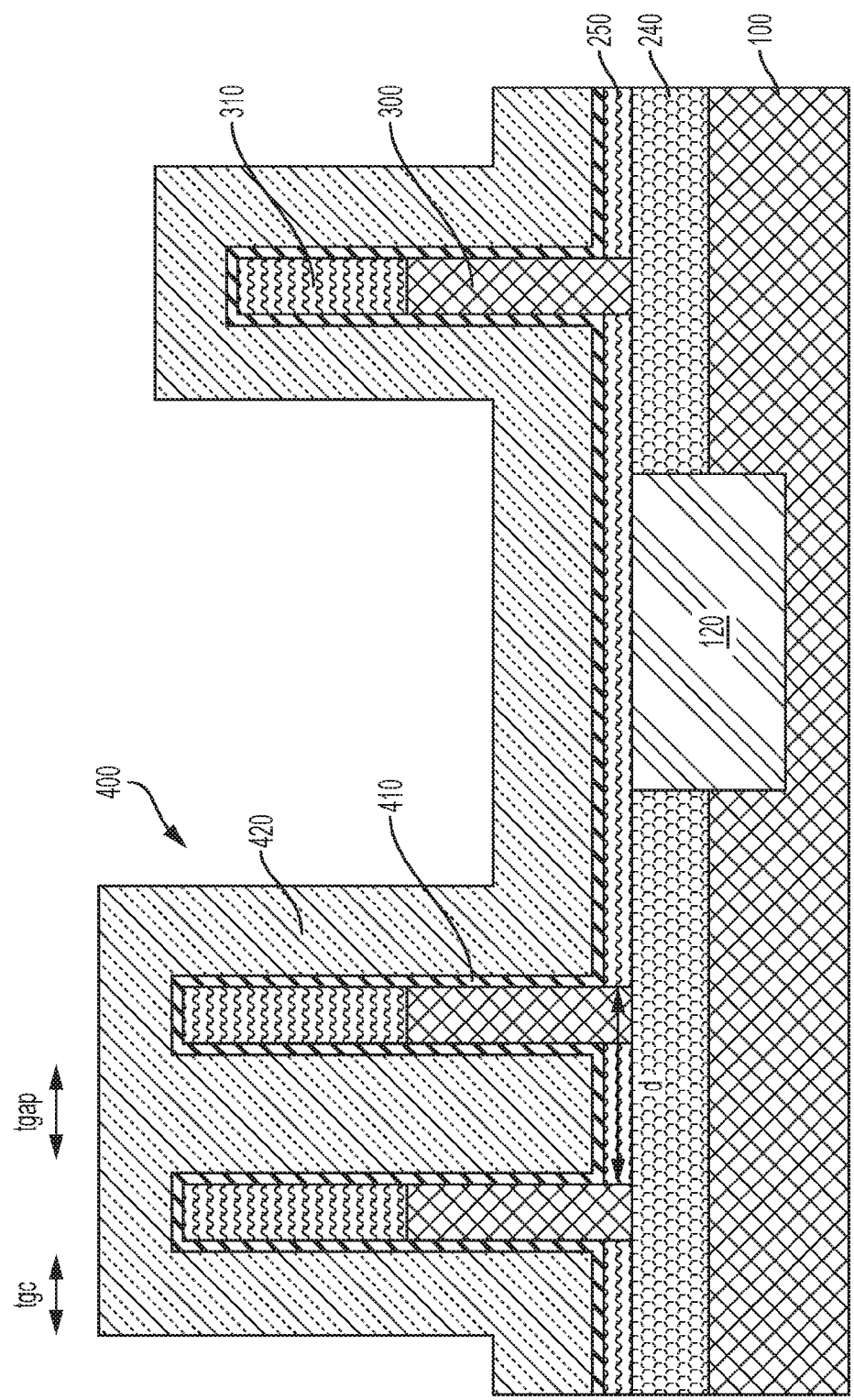
FIG. 2 shows the formation of a gate stack including a gate dielectric and a gate conductor over the semiconductor fins and hard mask structures of FIG. 1.

Referring to FIG. 2, a gate stack is then formed above the bottom spacer 250 and over the sidewalls of the fins 300. The gate stack 400 comprises a gate dielectric 410 and a gate conductor 420, which are deposited in succession. The gate dielectric 410 may be a conformal layer that is formed over exposed surfaces of the fins and over the bottom spacer 250. Gate dielectric 410 may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 410 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values. In various embodiments, the gate dielectric 410 includes a thin layer (e.g., 0.5 nm) of silicon oxide and an overlying layer of high-k dielectric material.

A gate conductor 420 is formed over the gate dielectric 410. The gate conductor 420 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 420 may comprise one or more layers of such materials such as, for example, a metal stack including a barrier layer, work function layer, and conductive fill layer.

The gate conductor 420 may be a conformal layer that is formed over exposed surfaces of the structure shown in FIG. 2, i.e., directly over the gate dielectric 410. The gate conductor 420 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The gate conductor thickness ($t_{gc}$) may range from 5 nm to 50 nm, e.g., 5, 10, 15, 20, 30, 40 or 50 nm, including ranges between any of the foregoing values.

According to various embodiments, due to the proximity of selected fins 300 to each other (e.g., where d≤100 nm), the gate conductor 420 formed over the gate dielectric layer of adjacent fin sidewalls can pinch-off and merge in the region between adjacent fins. As used herein, "adjacent fins" are arranged at a fin-to-fin spacing of 100 nm or less. The consolidated (merged) gate conductor thickness may range from 10 to 100 nm, e.g., 10, 20, 30, 40, 50, 60, 70, 80, 90 or 100 nm, including ranges between any of the foregoing values. In various exemplary embodiments, the gate conductor thickness ($t_{gc}$) is substantially equal to the inter-fin spacing ($t_{gap}$). In particular, the gate conductor thickness on the sidewalls of the fins is substantially equal to the inter-fin spacing.

Figure 3:
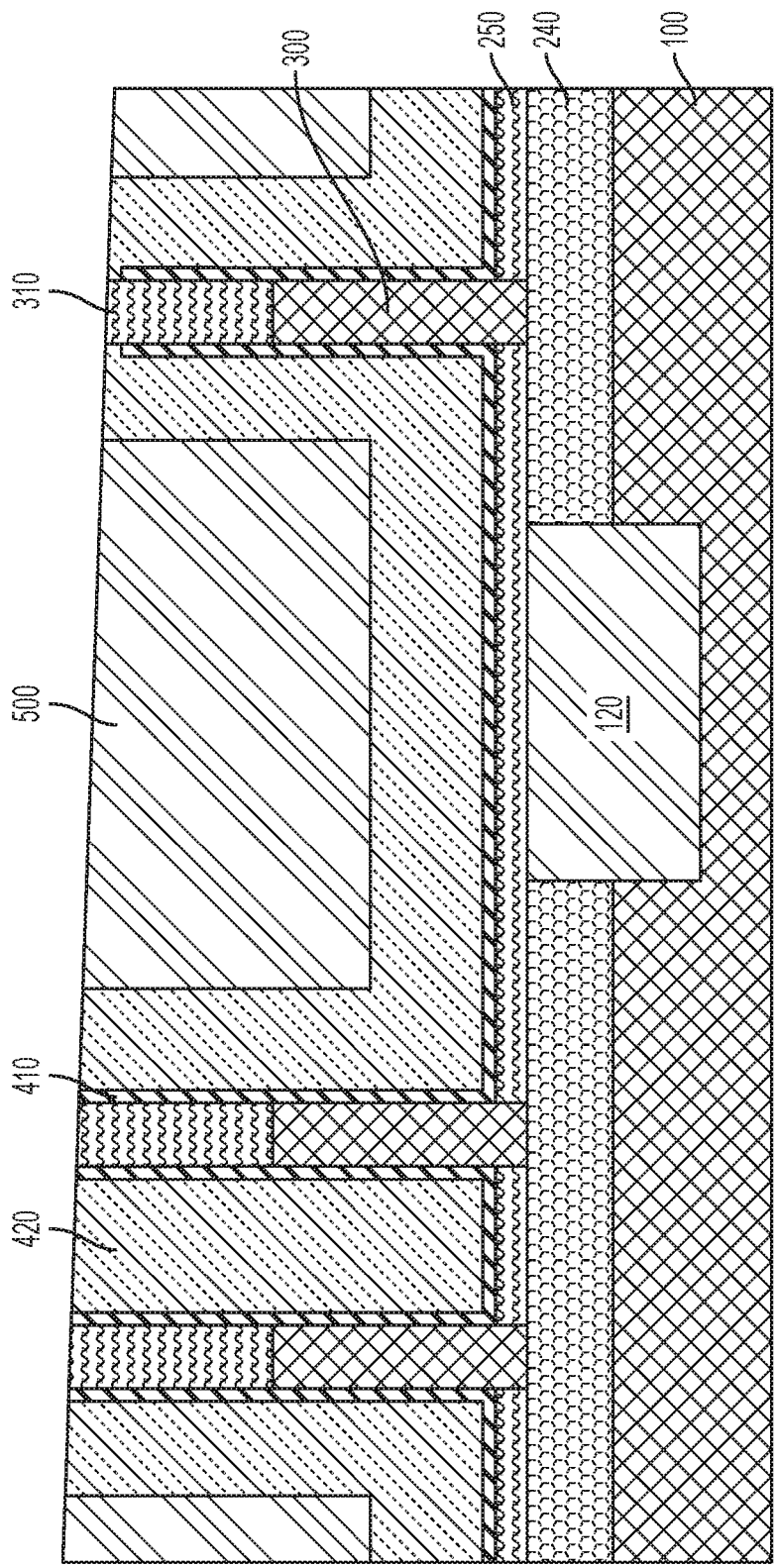
FIG. 3 depicts a post-planarization architecture after deposition of an interlayer dielectric.

Referring next to FIG. 3, dielectric layer 500 is formed over the gate conductor 420. Dielectric layer 500 may comprise silicon oxide, silicon nitride, silicon oxynitride or combinations thereof. In particular embodiments, dielectric layer 500 includes a layer of silicon oxide and a layer of silicon nitride. For example, the dielectric layer 500 may include a layer of silicon nitride formed directly over the gate conductor 420, and a fill layer of silicon dioxide formed directly over the layer of silicon nitride. The silicon nitride/silicon dioxide architecture of the example dielectric layer 500 facilitates its removal during subsequent processing.

The dielectric layer 500 may be self-planarizing, or the top surface of the dielectric layer 500 can be planarized, for example, by chemical mechanical polishing (CMP). Chemical mechanical polishing (CMP) is a material removal process that uses both chemical reactions and mechanical forces to remove material and planarize a surface. Patterned hard mask 310 may function as a CMP stop during planarization of the dielectric layer 500, during which step the gate dielectric 410 may be removed from over the hard mask 310. As illustrated in FIG. 3, variability in the thickness of the hard mask 310 may result in a global planarized structure having a top surface that is not parallel to the planar top surface of the semiconductor substrate 100.

Figure 4:
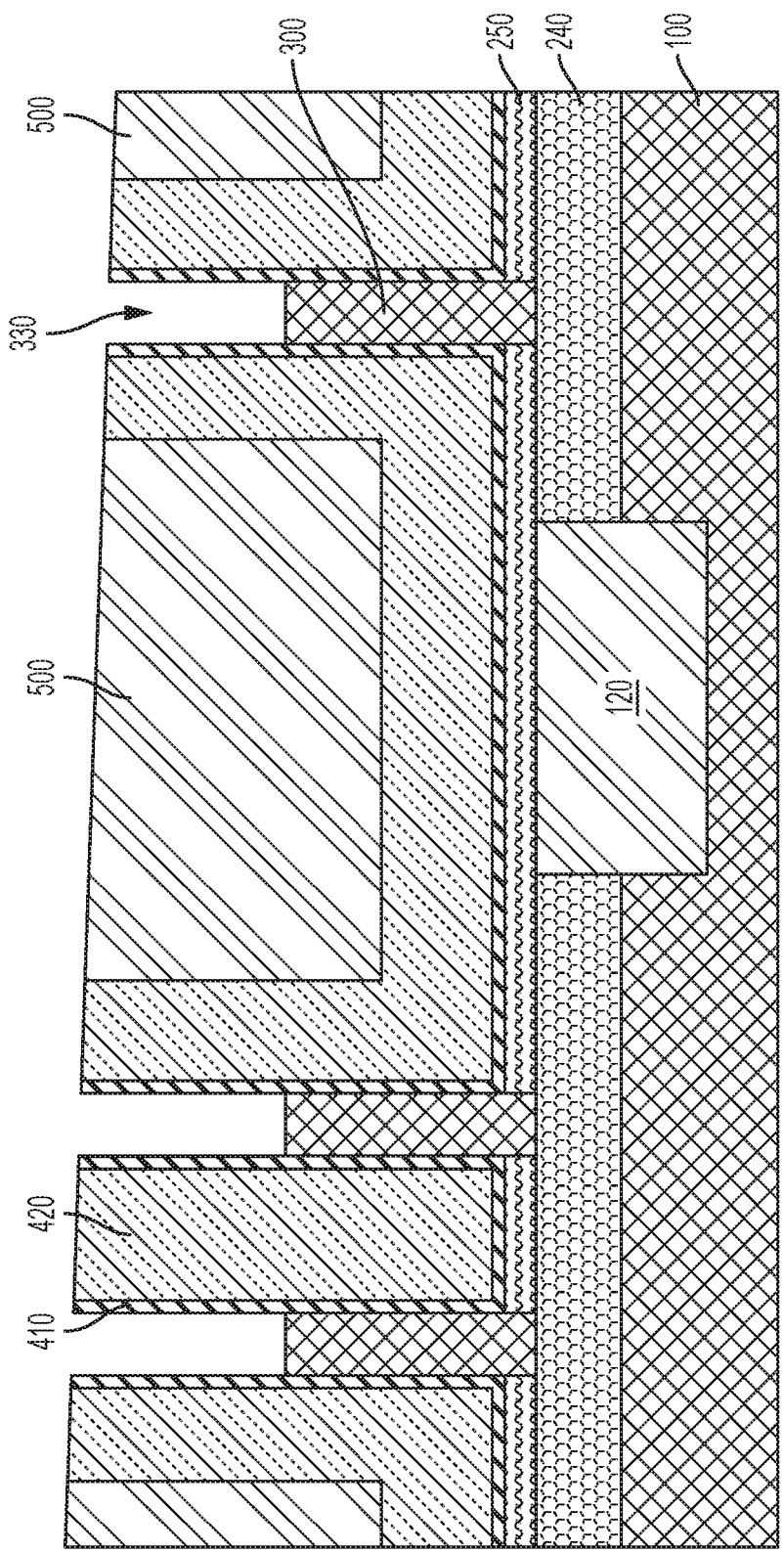
FIG. 4 shows the selective removal of the hard mask from over the semiconductor fins defining openings over and aligned with the fins.
Figure 5:
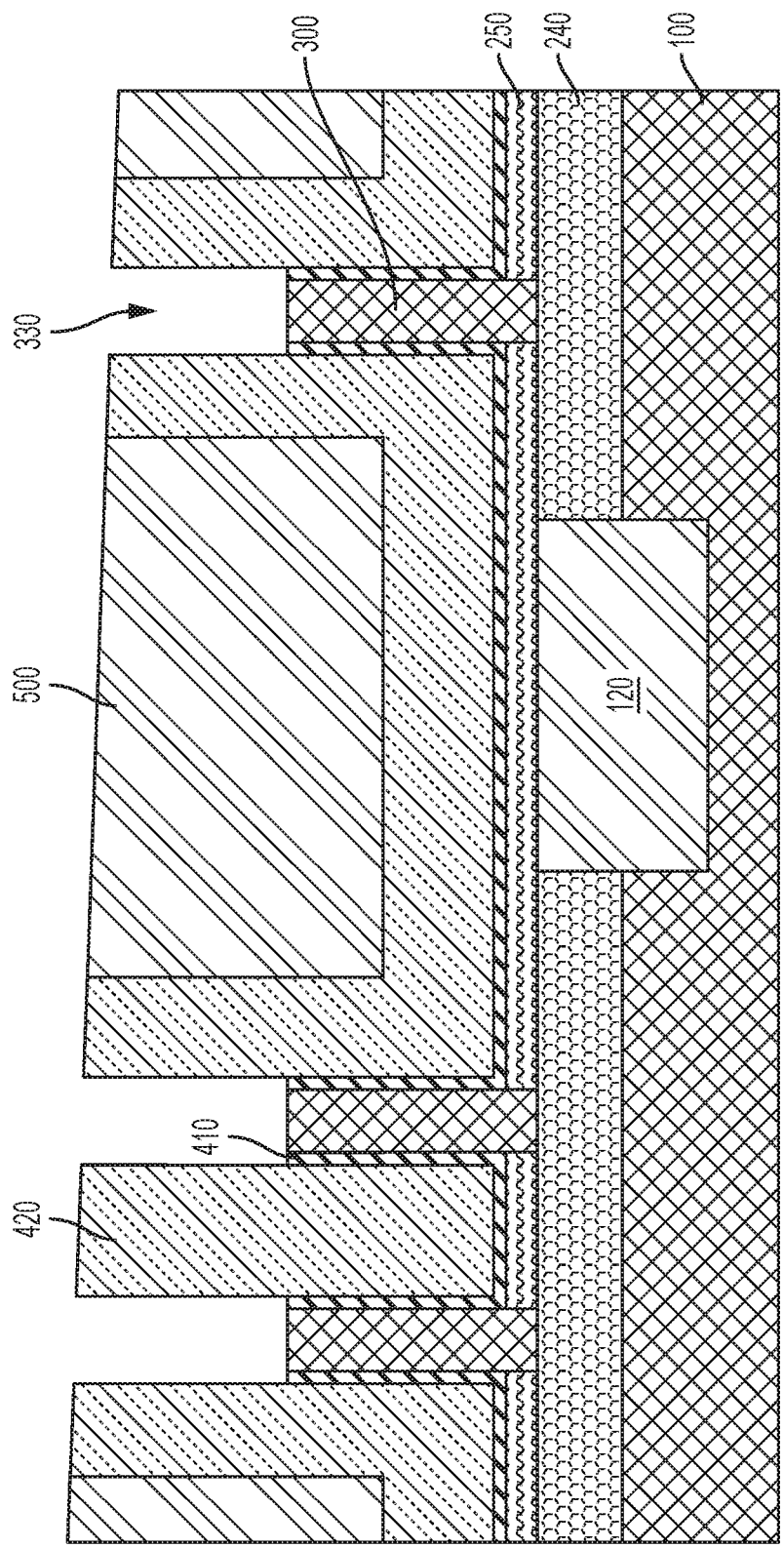
FIG. 5 shows the selective removal of the gate dielectric exposed within the openings of FIG. 4.

Referring to FIG. 4, a selective etch is used to remove the hard mask and form cavities 330 within the gate architecture over the fins 300. The cavity-forming etch may be an isotropic or an anisotropic etch. A further selective etch is then used to remove exposed portions of the gate dielectric layer 410 from within cavities 330, as shown in FIG. 5.

Figure 6:
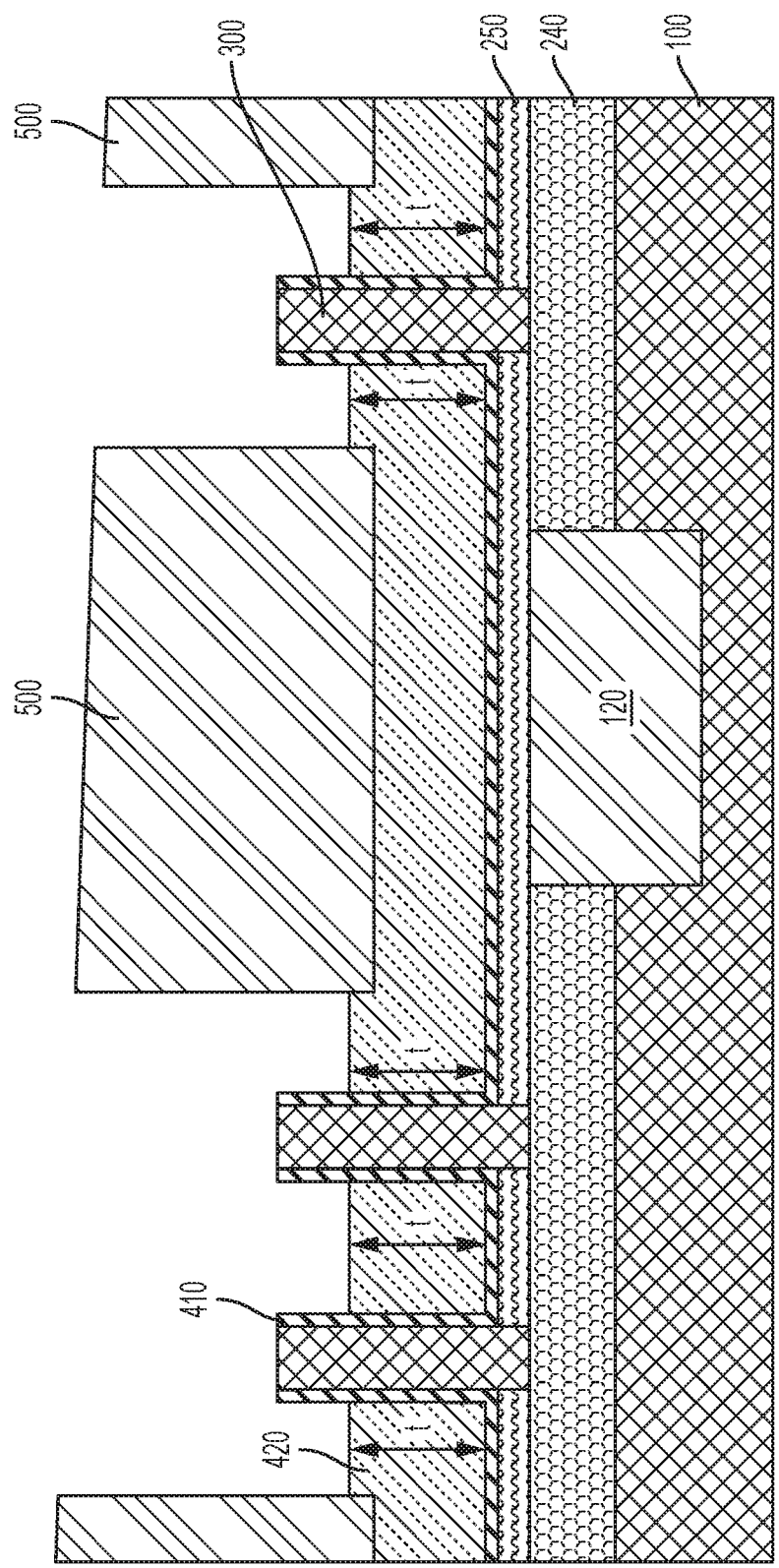
FIG. 6 shows the isotropic etch back of the gate conductor to a uniform height above the semiconductor substrate defining a uniform channel length over plural devices.

FIG. 6 shows the isotropic etch back of the gate conductor 420 to a uniform height above the semiconductor substrate. In certain embodiments, the isotropic etch of the gate conductor may comprise a dry etching process such as, for example, reactive ion etching. In other embodiments, the isotropic etch may comprise a wet etch. In still further embodiments, a combination of dry etching and wet etching can be used.

During the isotropic etch, the vertical and lateral etch rates of the gate conductor are comparable. Because the gate conductor 420 presents substantially equal lateral dimensions on each side of the fin, and the thickness of the gate conductor 420 is comparable to the spacing between adjacent fins ($t_{gc} \approx t_{gap}$), the lateral etch-back of the gate conductor removes the conductive material to a uniform depth, independent of the geometry above the fins and any attendant loading effects, which results in a uniform channel height. Etch-back of the gate conductor defines a functional gate over the fins. A "functional gate" is operable to switch the semiconductor device from an "on" state to "off" state, and vice versa.

The recessed height (t) of the gate conductor may be 5 to 50 nm, e.g., 5, 10, 20, 30, 40 or 50 nm, including ranges between any of the foregoing values. As a percentage of the height (H) of the fin 300, the gate height (t) may be 25% to 90% of the fin height (H), e.g., 25, 50 or 75% of the fin height, including ranges between any of the foregoing values.

Figure 7:
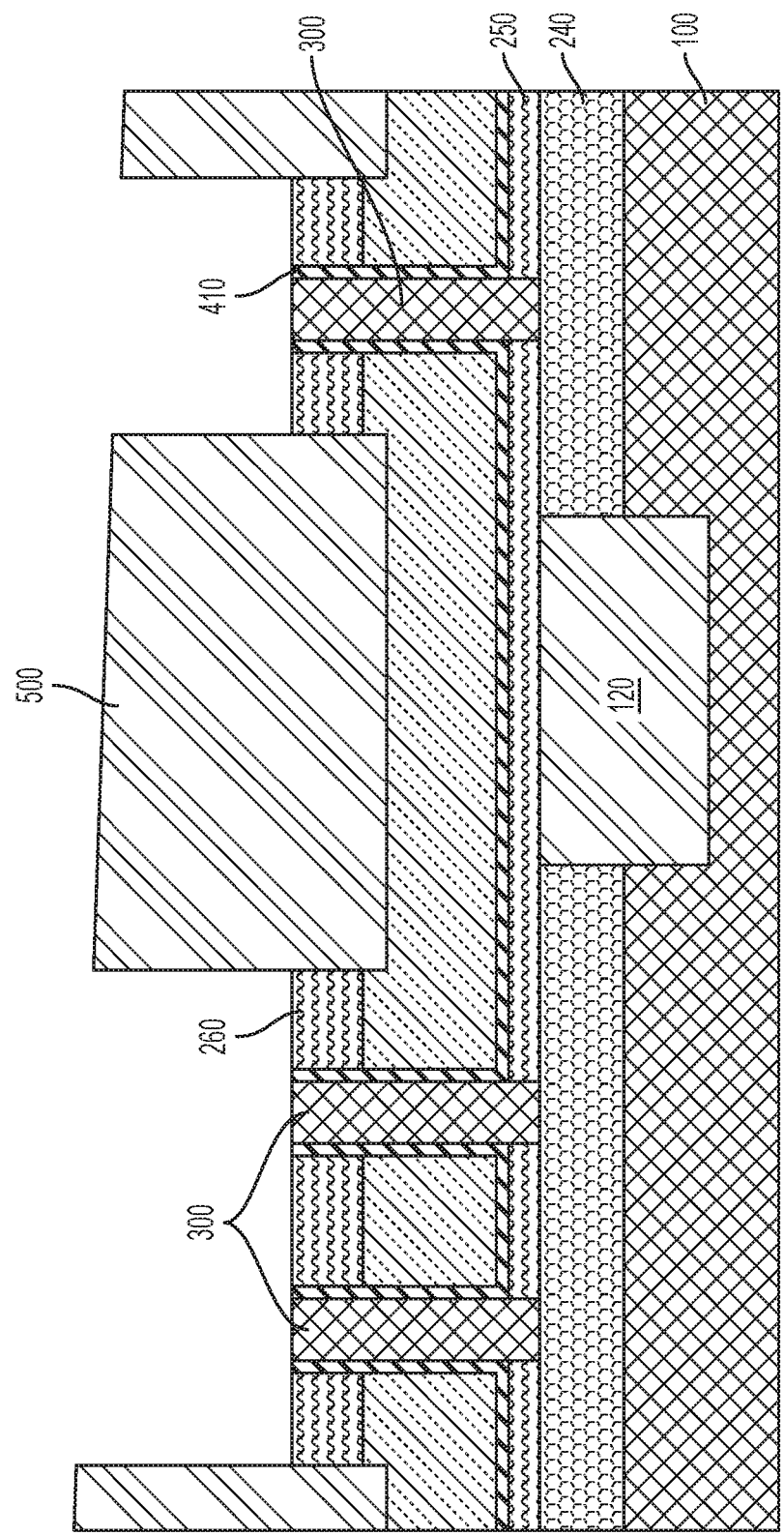
FIG. 7 illustrates the formation of a top spacer over the recessed gate conductor.

Thereafter, referring to FIG. 7, a top spacer layer 260 is formed over the recessed gate. In various embodiments, formation of the top spacer layer 260 includes a conformal deposition process such as chemical vapor deposition (CVD), followed by an anisotropic etch to remove the spacer material(s) from horizontal surfaces and expose the fins along top surfaces thereof. In other embodiments, a non-conformal deposition an isotropic etch back may be used.

The thickness of the top spacer 260 may range from 1 to 10 nm, e.g., 1, 2, 5 or 10 nm, including ranges between any of the foregoing values. The top spacer 260 may comprise, for example, silicon nitride ($Si_xN_y$). Alternatively, top spacer 260 may comprise other dielectric materials such as silicon nitride, silicon oxynitride, a low-k material, or any suitable combination of these materials. Top spacer layer 260 is adapted to isolate the top source/drain junction 270 from the gate of the transistor. In particular embodiments, the top spacer material may be chosen to provide etch selectivity with respect to dielectric layer 500, which facilitates etch back of the top spacer 260 and, in certain embodiments, removal of the dielectric layer 500 during subsequent processing.

Figure 8:
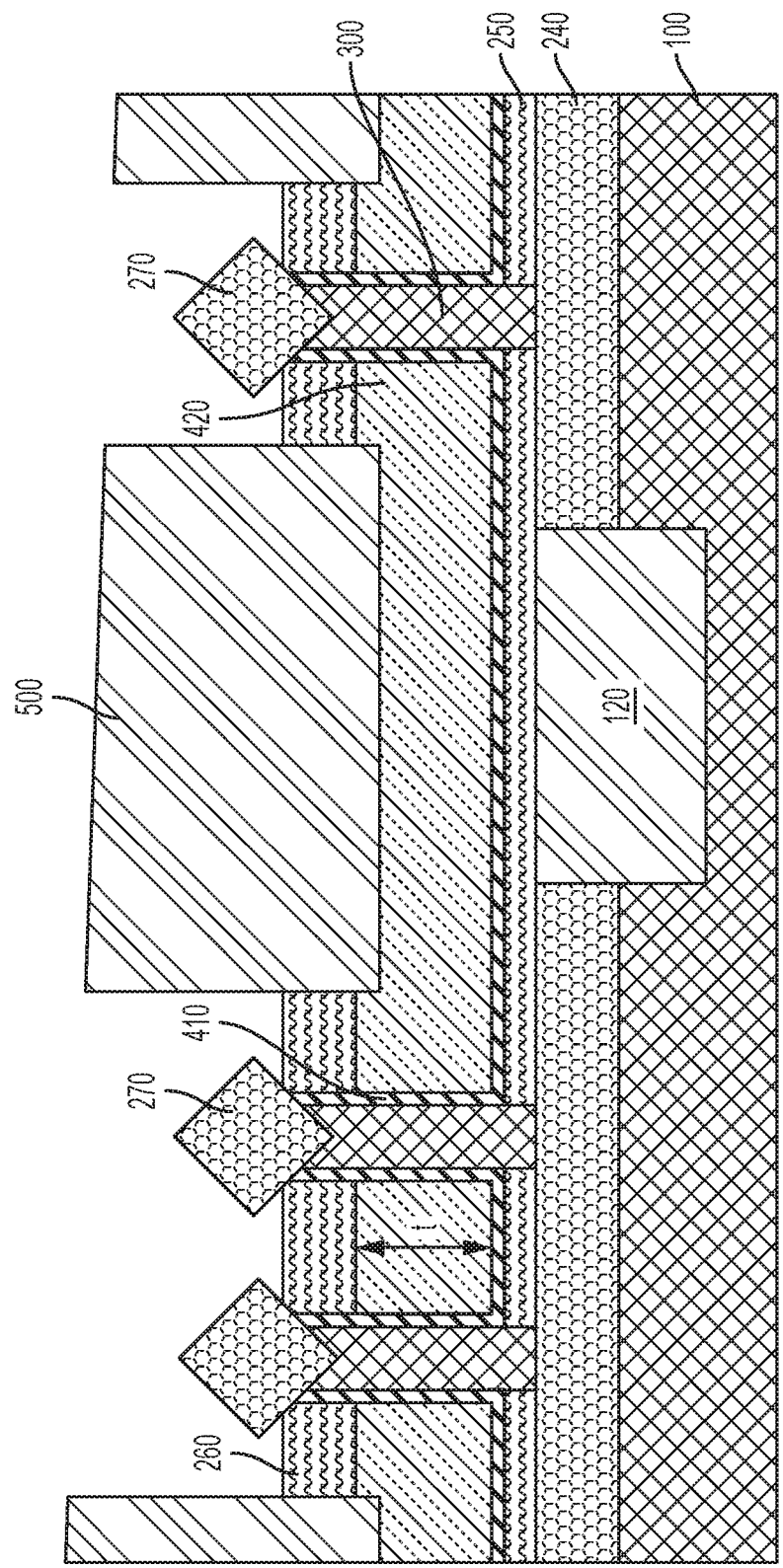
FIG. 8 depicts the formation of top source/drain raised active regions over portions of the fins.

FIG. 8 depicts the formation of top source/drain junctions 270 over portions of the fins. Top source/drain junctions 270 may be formed by selective epitaxial growth from exposed portions of the semiconductor fins. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Top source/drain junctions 270 may comprise silicon, silicon germanium, or another suitable semiconductor material.

The selective epitaxy process deposits an epitaxial layer directly onto the exposed surfaces of the fins adjacent to the top spacer 260. Exposed surfaces of the fins may include the top surface as well as upper portions of the sidewalls of the fins proximate to the top surface. In various embodiments, a silicon epitaxial layer is formed without deposition of silicon on the exposed dielectric surfaces. Selective epitaxial layers may be formed using molecular beam epitaxy or chemical vapor deposition processes that are adapted for selective epitaxy.

An example silicon epitaxial process for forming top source (or drain) region(s) uses a gas mixture including $H_2$ and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$). In certain embodiments, one or more gases comprising a dopant species may be incorporated into the gas source.

Inter-fin merger of the top source/drain junctions 270 may be accomplished during epitaxial growth or during post-epitaxy deposition of a conductive filler to bridge (or strap) the junctions from fin-to-fin. In various embodiments, the dopant type and dopant concentration with the top source/drain junctions 270 are equal or comparable to the dopant type and dopant concentration within the bottom source/drain junctions 240.

Figure 9:
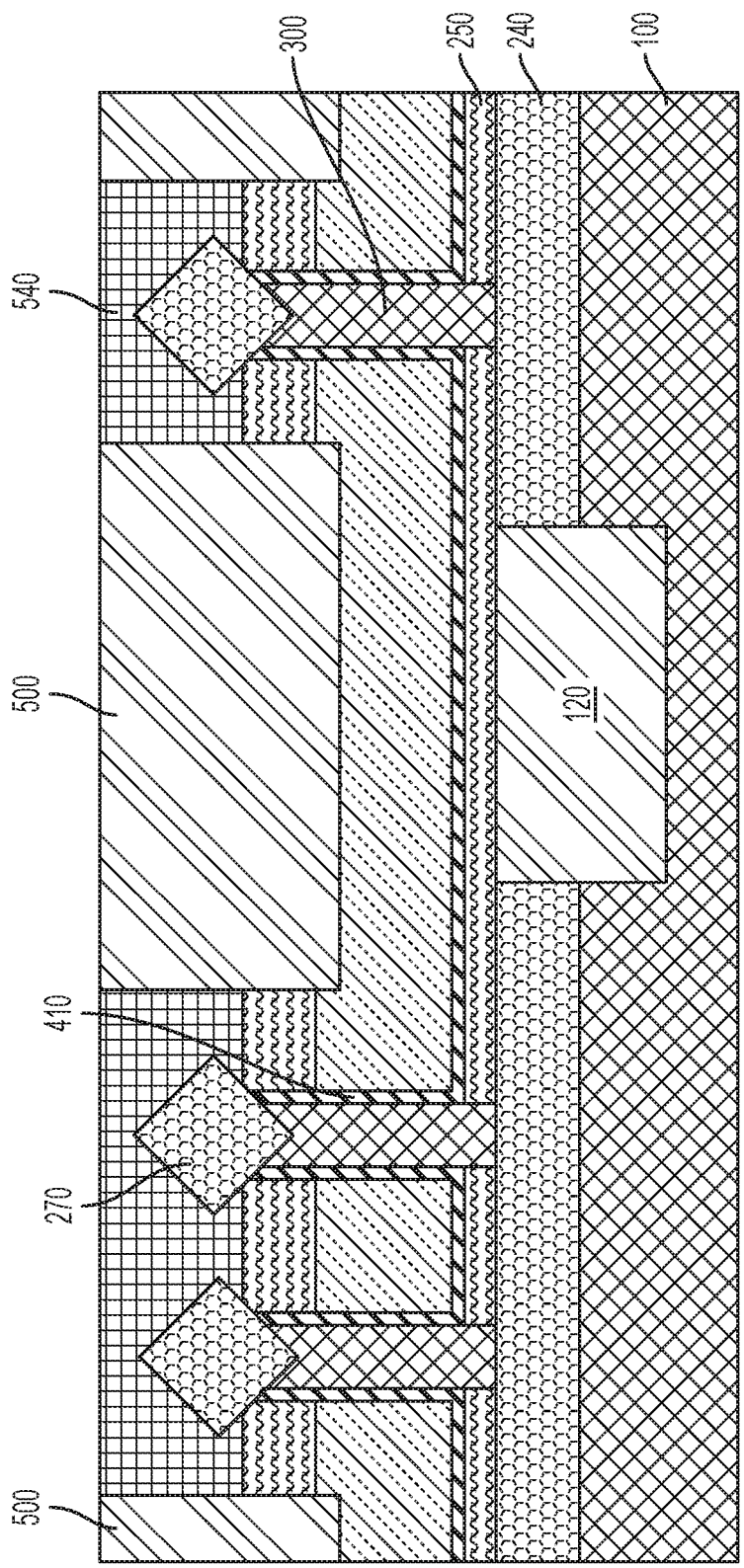
FIG. 9 shows the formation of a top capping layer over the raised active regions.

FIG. 9 shows the formation of a top capping layer 540 over top spacer 260 and over the top source/drain junctions 270. In various embodiments, formation of the top capping layer 540 includes a conformal deposition process, followed by an anisotropic etch-back. The top capping layer 540 may be deposited by a suitable process such as atomic layer deposition (ALD), chemical vapor deposition (CVD), physical vapor deposition (PVD), or combinations thereof. The top capping layer 540 may be self-planarizing, or the top surface of the top capping 540 can be planarized using CMP. Dielectric layer 500 may function as a CMP etch stop during planarization of the top capping 540.

In various embodiments, top capping layer 540 comprises a dielectric material such as an oxide, nitride, or oxynitride. In particular embodiments, the top capping layer 540 comprises a nitride material such as silicon nitride, which provides etch selectivity with respect to dielectric layer 500, which may comprise an oxide material such as silicon oxide.

Figure 10:
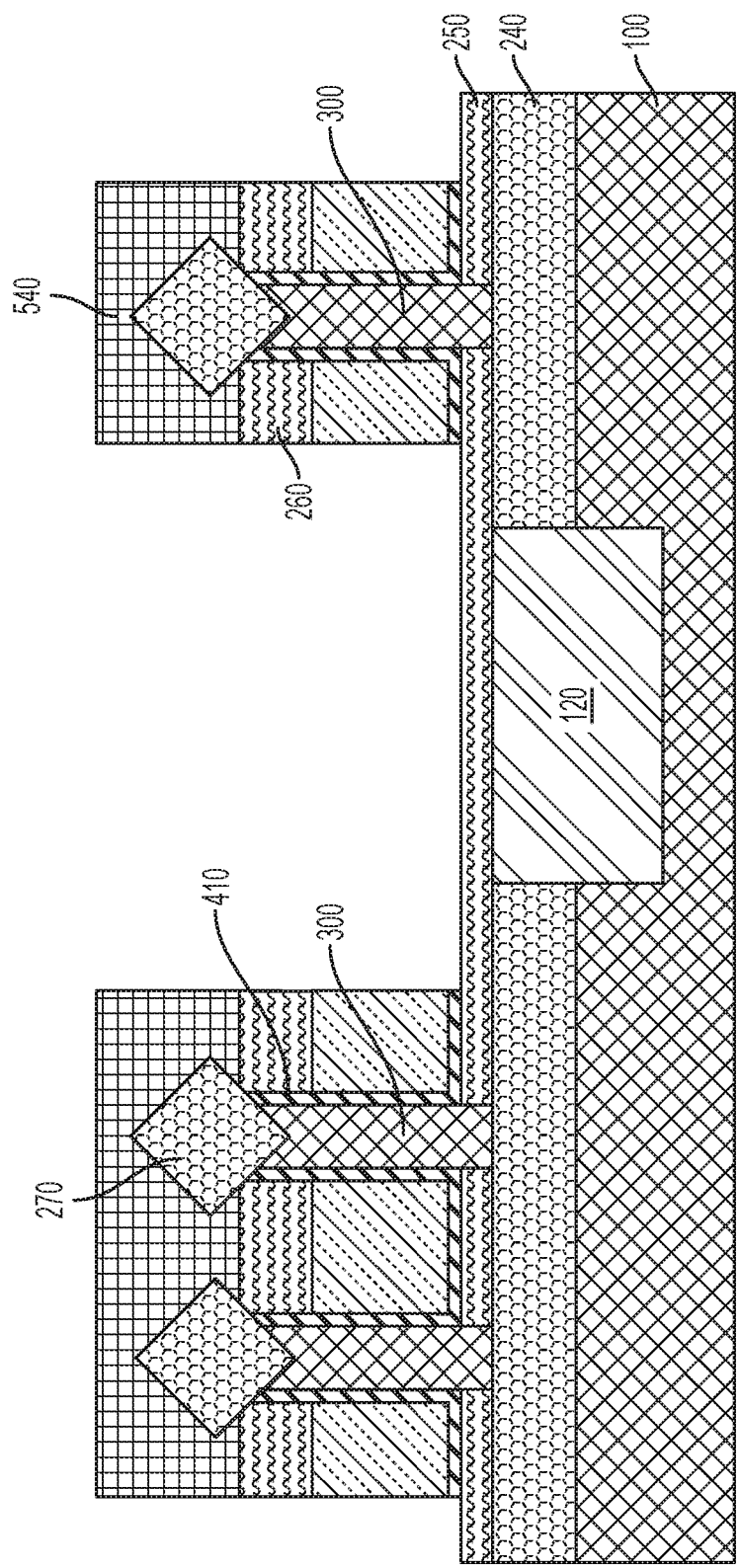
FIG. 10 is a post-gate etch geometry showing the formation of discrete vertical FET devices having uniform channel lengths.

FIG. 10 is a post-gate etch geometry showing the formation of discrete vertical FET devices. The gate etch includes removing dielectric layer 500 and gate conductor 420 selective to top capping layer 540.

Illustrated in FIGS. 1-10 are embodiments of a process to form a vertical field effect transistor, as well as the resulting structure, having a controlled channel length. The vertical transistor architecture includes one or more fins connecting a source region with a drain region. In certain embodiments, the top and bottom source/drain junctions are respectively shared across a plurality of the fins.

In contrast to conventional processes, which use directed, vertical etch-back of gate materials in either blanket or wrap-around structures to define the gate length, the present approach uses a self-aligned isotropic recess etch, which is insensitive to loading effects. By matching the lateral, inter-fin gate conductor dimension with the overall thickness of the gate conductor layer, the isotropic etch produces a recessed gate conductor having a uniform vertical thickness.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of making a vertical FET device comprising:
    forming a plurality of fins over a semiconductor substrate, wherein the fins define an inter-fin spacing between sidewalls of adjacent fins;
    forming a hard mask over top surfaces of the fins;
    forming a gate dielectric directly over the sidewalls of the fins and over sidewalls of the hard masks;
    forming a gate conductor directly over the gate dielectric, wherein the gate conductor thickness is substantially equal to the inter-fin spacing;
    isotropically etching the gate conductor to form a functional gate; and
    removing the hard mask to expose the top surfaces of the fins and removing the gate dielectric formed over the sidewalls of the hard mask prior to isotropically etching the gate conductor.

2. The method of claim 1, further comprising forming bottom source/drain regions in the semiconductor substrate prior to forming the gate dielectric.

3. The method of claim 2, wherein the bottom source/drain regions are formed by ion implantation into the semiconductor substrate.

4. The method of claim 2, further comprising forming a bottom spacer over the bottom source/drain regions prior to forming the gate dielectric.

5. The method of claim 1, wherein the gate conductor thickness over the sidewalls of the fins is substantially equal to the inter-fin spacing.

6. The method of claim 1, wherein the inter-fin spacing between adjacent fins is filled by the gate dielectric and the gate conductor.

7. The method of claim 1, further comprising forming a top spacer over the gate conductor after etching the gate conductor.

8. The method of claim 1, further comprising forming top source/drain regions over the exposed top surfaces of the fins.

9. The method of claim 8, wherein the top source/drain regions are formed by selective epitaxy.

10. The method of claim 8, further comprising forming a top capping layer over the top source/drain regions.

11. The method of claim 1, wherein the hard mask thickness over a first fin differs from the hard mask thickness over a second fin by at least 10%.

12. The method of claim 1, wherein the hard mask thickness over a first region of a first fin differs from the hard mask thickness over a second region of the first fin by at least 10%.

13. The method of claim 1, wherein the isotropic etching comprises wet etching.

14. A method of making a vertical FET device comprising:
   forming a plurality of fins over a semiconductor substrate, wherein the fins define an inter-fin spacing between sidewalls of adjacent fins;
   forming a hard mask over top surfaces of the fins;
   forming a gate dielectric directly over the sidewalls of the fins and over sidewalls of the hard masks;
   forming a gate conductor directly over the gate dielectric, wherein the gate conductor thickness is substantially equal to the inter-fin spacing; and
   isotropically etching the gate conductor to form a functional gate, wherein isotropically etching the gate conductor decreases the gate conductor height to below the top surfaces of the fins.

15. The method of claim 14, wherein the gate conductor height is 25% to 75% of the fin height.

* * * * *